(12) United States Patent
Halik et al.

(10) Patent No.: US 6,867,442 B2
(45) Date of Patent: Mar. 15, 2005

(54) SURFACE-FUNCTIONALIZED INORGANIC SEMICONDUCTOR PARTICLES AS ELECTRICAL SEMICONDUCTORS FOR MICROELECTRONICS APPLICATIONS

(75) Inventors: Marcus Halik, Erlangen (DE); Günter Schmid, Hemhofen (DE); Katja Steffen, Höchstadt (DE); Hagen Klauk, Erlangen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/425,460

(22) Filed: Apr. 29, 2003

(65) Prior Publication Data

US 2003/0227116 A1 Dec. 11, 2003

(30) Foreign Application Priority Data

Apr. 29, 2002 (DE) ......................................... 102 19 120

(51) Int. Cl.⁷ .............................................. H01L 23/58
(52) U.S. Cl. ..................................... 257/212; 438/106
(58) Field of Search ................................ 257/212, 213, 257/214, 215, 40, 59, 200, 201, 288, 678, 643, 645, 744, 745, 778, 914; 438/106, 64, 55, 51

(56) References Cited

U.S. PATENT DOCUMENTS 5,248,772 A * 9/1993 Siiman et al. ............... 536/112
5,639,620 A * 6/1997 Siiman et al. ............... 435/7.21
5,707,877 A * 1/1998 Siiman et al. ............... 436/518
6,548,168 B1 * 4/2003 Mulvaney et al. .......... 428/402

FOREIGN PATENT DOCUMENTS

| DE | 100 59 498 A1 | 6/2002 |
| WO | 99/19900 | 4/1999 |

OTHER PUBLICATIONS

David J. Gundlach et al.: "High–Mobility, Low–Voltage Organic Thin Film Transistors", *1999 International Electron Devices Meeting*, Dec. 1990, 4 pgs.
Brent A. Ridley et al.: "All–Inorganic Field Effect Transistors Fabricated by Printing", *Science*, vol. 286, Oct. 22, 1999, pp. 746–749.
M. G. Kane et al.: "Analog and Digital Circuits Using Organic Thin–Film Transistors on Polyester Substrates", *IEEE Electron Device Letters*, vol. 21, No. 11, Nov. 2000, pp. 534–536.

* cited by examiner

Primary Examiner—David Nhu
(74) Attorney, Agent, or Firm—Laurence A. Greenberg; Werner H. Stemer; Ralph E. Locher

(57) ABSTRACT

A semiconductor device has a first contact, by which charge carriers are injected into a semiconductor path, and a second contact, by which the charge carriers are extracted from the semiconductor path. The semiconductor path is formed by surface-modified semiconductor particles that bear alkyl or aryl ligands at their surface. The modification with ligands enables the semiconductor particles to form a stable dispersion that can easily be applied to a substrate with a printing technique. Consequently, the semiconductor device according to the invention can be produced very easily and inexpensively.

14 Claims, 1 Drawing Sheet

SURFACE-FUNCTIONALIZED INORGANIC SEMICONDUCTOR PARTICLES AS ELECTRICAL SEMICONDUCTORS FOR MICROELECTRONICS APPLICATIONS

BACKGROUND OF THE INVENTION

Field of the Invention

The invention relates to a semiconductor device having at least one semiconductor path, a first contact for injecting charge carriers into the semiconductor path and a second contact for extracting charge carriers from the semiconductor path. The invention further relates to a printable formulation that can be used to produce the semiconductor path included in the semiconductor device, and to a method for fabricating the semiconductor device.

Semiconductor chips have found widespread use in a wide range of technical applications. They are generally based on silicon in the form of a semiconductor substrate, in which semiconductor components are integrated in numerous working steps. Semiconductor chips are therefore complicated and expensive to fabricate. The use of silicon makes the chips inflexible and can only be worn down to very small layer thicknesses, so that flexible substrates are obtained, with a high level of outlay. Therefore, microchips are only suitable for demanding applications for which high costs are acceptable. If the costs for the fabrication of microchips could be reduced considerably, this would open up the door to a wide range of applications that are subject to heavy cost pressures. Examples of these applications include labels for marking goods in which data about the goods is stored on the labels. The information can, for example, be read without contact at a checkout. Further examples are electronic postage stamps or, in general terms, applications in transponder technology. A further application is a thin sheet with integrated control elements for liquid crystal screens.

One possible way of reducing costs is to use organic semiconductors. These materials are readily accessible and can be patterned very easily, for example using printing processes. However, the use of organic semiconductors of this type is currently still limited by the low mobility of the charge carriers in the organic polymer semiconductors. This mobility is currently at most 1 to 2 $cm^2/Vs$. The maximum operating frequency of transistors, and therefore of the electronic circuit, is limited by the mobility of the charge carriers. Although mobilities of the order of magnitude of $10^{-1}$ $cm^2/Vs$ are sufficient for driver applications in the production of TFT active matrix displays, organic semiconductors have not hitherto proven suitable for radiofrequency applications. For technical reasons, wireless transmission of information (RF ID systems) can only take place above a certain minimum frequency. In systems that draw their energy directly from the electromagnetic alternating field and therefore also do not generate any voltage of their own, carrier frequencies of approximately 125 kHz or 13.56 MHz are in widespread use. Systems of this type are used, for example, for identifying or labeling articles in smartcards, identification tags or electronic postage stamps.

Processes in which semiconducting molecules, for example pentacene or oligothiophenes, can be deposited as far as possible in an ordered manner have been developed for improving the charge transport in organic semiconductors. This is possible, for example, by vacuum sublimation. The higher crystallinity of the semiconductor material leads to an improved π-π overlap between the molecules or the side chains, with the result that the energy barrier for charge carrier transport can be reduced. By substituting the semiconducting molecular units with bulky groups, it is possible, in the deposition of the organic semiconductor from the liquid or gas phase, to produce domains that have liquid crystal properties. Furthermore, synthesis methods in which as high a regioregularity as possible is achieved in the polymer by the use of asymmetric monomers have been developed.

Electrically semiconducting polymers are used, for example, in field effect transistors or electronic components that are based on a field effect. A description of a configuration of this type can be found, for example, in the references by N. G. Kane, J. Campi, M. S. Hammond, F. P. Cuomo, B. Greening, C. D. Sheraw, J. A. Nichols, D. J. Gundlach, J. R. Huang, C. C. Kuo, L. Jia, H. Klauk, D. N. Jackson, titled "IEEE Electron Device Letters", Vol. 21, No. 11 (2000), 534 or by D. J. Gundlach, H. Klauk, C. D. Sheraw, C. C. Kuo, J. R. Huang, D. N. Jackson, titled "1999 International Electron Devices Meeting", December 1990.

For organic polymers to be used in field effect transistors or similar electronic components, it is necessary for the polymer to behave like an insulator when no electric field is applied, while it forms semiconductor properties or a conduction channel under the influence of an electric field. For example, polyphenylenes or naphthalene derivatives have such properties. However, owing to their insolubility, these are not processable, i.e. these compounds cannot be used to produce field effect transistors.

One difficulty with using transistors of this type consists in the high contact resistance when charge carriers are transferred between contacts and the semiconductor path, which is caused by the low electrical conductivity of the organic semiconductor. The electrical conductivity of many organic semiconductor materials, as with inorganic semiconductors, can be increased by the introduction of suitable dopants. However, there are problems with achieving positional selectivity during doping. In the organic semiconductors, the dopants are not bonded at a specific position and can move freely within the material. Even if the doping process can originally be restricted to a defined region, for example the regions around the source and drain contacts of the transistor, the dopants subsequently migrate through the entire organic semiconductor layer under the influence of the electric field which is applied between the source and drain contacts in order to operate the transistor.

A clear advantage of electronic components based on organic semiconductors resides in the possibility of producing the components at low cost by simple measures. International Patent Disclosure WO 99/39373 describes a process for producing organic semiconductor devices in which the organic semiconductor material is applied to a substrate in an inkjet method. In this way, it has been possible to produce light-emitting diodes with polyvinyl carbazole as semiconductor material; it was possible to influence the color of the light emitted by doping the semiconductor material with dyes, such as coumarins.

International Patent Disclosure WO 99/19900 describes a method that enables microelectronic configurations to be produced by dropwise application of a solution of an organic semiconductor.

A significant obstacle in the fabrication of microelectronic configurations based on organic semiconductors, however, is the fact that the solubility of the organic materials in solvents is generally poor. Consequently, the range of organic semiconducting materials that can be used to produce microelectronic circuits by printing techniques is very restricted, which represents a significant difficulty in the search for inexpensive fabrication of circuits of this type.

Inorganic materials have considerably higher charge carrier mobility than organic semiconductors.

The charge carrier mobility is retained even if the semiconductor material is not present as a continuum, but rather in the form of nanoparticles. For example, the reference by Ridley et al., Science 286 (1999), 746–749 were able to use the example of cadmium selenide to demonstrate that the semiconductor material, even in the form of nanoparticles with a diameter of less than 10 nm, has significantly better charge carrier mobilities than organic materials. On account of its extraordinarily high toxicity, however, cadmium selenide is not suitable for use on a large scale or in articles for everyday use, since its use in disposable articles, such as labels, would lead to unacceptable environmental pollution.

Published, Non-Prosecuted German Patent Application DE 100 59 498 A1 describes a method for fabricating printable semiconductor circuits based on inorganic semiconductor particles. However, the semiconductor particles still have an unsatisfactory solubility, and consequently then can only be applied to a substrate by printing with considerable difficulty. Furthermore, the materials properties of the inorganic nanoparticles can only be varied slightly, for example the mobility and number of charge carriers and the contact resistance when the charge carriers are transferred from or to an electrical contact to or from the semiconductor material.

SUMMARY OF THE INVENTION

It is accordingly an object of the invention to provide a surface-functionalized inorganic semiconductor particles as electrical semiconductors for microelectronics applications that overcomes the above-mentioned disadvantages of the prior art devices of this general type, which can be fabricated easily and at low cost and is also suitable for radiofrequency applications.

With the foregoing and other objects in view there is provided, in accordance with the invention, a semiconductor device. The semiconductor device contains at least one semiconductor path. The semiconductor path is substantially formed from surface-modified semiconductor particles each having a base body formed from a semiconductor particle and a monomolecular layer of ligands disposed on a surface of the base body. A first contact is coupled to the semiconductor path for injecting charge carriers into the semiconductor path, and a second contact is coupled to the semiconductor path for extracting the charge carriers from the semiconductor path.

The object is achieved by the semiconductor device having at least one semiconductor path, a first contact for injecting charge carriers into the semiconductor path, and a second contact for extracting charge carriers from the semiconductor path. The semiconductor path substantially being formed from surface-modified semiconductor particles that contain a base body formed from a semiconductor particle and a monomolecular layer of ligands disposed on a surface of the base body.

The fact that ligands are fixed to the surface of the semiconductor particle used as the base body makes it possible to influence the solubility or dispersability of the semiconductor particle. By selecting suitable ligands, it is possible to produce stable dispersions or solutions in suitable solvents, and the dispersions or solutions can then readily be applied to a substrate by printing techniques, for example inkjet printing. After they have been deposited, the surface-modified semiconductor particles form stable structures that, compared to organic semiconductor materials that have been used hitherto, are significantly less sensitive to environmental influences. The uniform distribution in the solvent enables the semiconductor path to be produced reproducibly with a uniform structure, so that only minor tolerances in the electrical properties have to be accepted during production. The ligands are able to influence the band structure of the semiconductor particle, so that a higher electrical conductivity of the semiconductor path can be achieved. The mobility of the charge carriers is greater in the semiconductor path of the semiconductor device according to the invention than in corresponding semiconductor devices based on organic semiconductors or non-functionalized semiconductor particles. The ligands disposed on the surface of the base body impart a polymeric character to the material of the semiconductor path, so that it can be permanently fixed to a substrate, with the result that the semiconductor device retains its ability to function even under the conditions of everyday use. The starting materials are generally inexpensive and available on an industrial scale. The techniques used to functionalize the surfaces of the semiconductor particles are also known and can be carried out at low cost.

The semiconductor particles that form the base body preferably have a diameter in the range from 1 nm to 100 $\mu$m. They can be produced either from solution using known methods, for example by reduction of corresponding metal salts, or by coagulation of sols. However, they may also be produced, for example, by milling coarser particles. Then, the ligands are bonded to the particles obtained in this way using known methods.

The semiconductor particles are preferably formed from an inorganic material. The materials may in this case vary within wide boundaries. It is possible to use elemental semiconductors from group IV of the periodic system, such as Si and Ge, and III/V semiconductors, such as GaAs or InP, IIb/VI semiconductors, for example compounds of zinc or cadmium with oxygen, sulfur, selenium or tellurium, Ib/VII semiconductors, such as CuCl, and further semiconductors, such as for example certain modifications of S, Se, Te and P, or semiconductors made from compounds such as $Cu_2O$, $TeO_2$, GaSe. The conductivity of the inorganic semiconductor materials can be modified by suitable doping in order, for example, to obtain p-Si or n-Si.

Details relating to properties and syntheses of microparticles and nanoparticles are to be found, for example, in the references by A. F. Holleman, E. Wiberg, N. Wiberg, Titled "Lehrbuch der anorganischen Chemie [Textbook of Inorganic Chemistry]", Walter de Gruyter, Verlag, Berlin, 1985, page 767 or by J. H. Fendler, "Nanoparticles and Nanostructure Films—Preparation, Characterization and Application", Wiley-VCA, 1998.

It is particularly preferable to use silicon nanoparticles (1 to 100 nm) or microparticles (100 nm to 100 $\mu$m) that are accessible, for example, by thermal decomposition of trichlorosilane, silane or similar compounds or by reaction of Zintl phases (KSi, MgSi) with silicon tetrachloride. Another example of a starting material that can be used is polycrystalline silicon that is produced, inter alia, as waste during the production of silicon single crystals by zone melting and which, to be used as inorganic semiconductor material, merely has to be comminuted to the desired size (2–100 $\mu$m). The starting material may already have been doped or alternatively the semiconductor particles may be doped in a subsequent step, for example by volatile compounds of the doping elements, such as for example $B_2H_6$ or $PH_3$. The doping may take place in a separate working step or during the functionalization of the semiconductor particles. By using semiconductor particles that are differently doped, for example p-doped and n-doped, it is possible to produce pn junctions in a diode, for example.

The ligands may be bonded to the base body by a coordinate bond. To ensure that the semiconductor device remains stable even over prolonged periods of time, however, the ligands are preferably bonded to the base body by a covalent bond. A covalent bond of this type can be produced, for example, by the semiconductor particles initially being activated at their surface and then being reacted with a corresponding ligand.

The semiconductor particles are preferably activated by oxidative bonding of a suitable leaving group to the surface of the semiconductor particles. The surface of the semiconductor particle is preferably activated by chlorination. The chlorination may, for example, take place in bulk by reaction of the semiconductor particles with hydrogen chloride at elevated temperature, for example 350° C., or by reaction of the semiconductor particles with gaseous chlorine at high temperature, for example 500° C. The chlorination may also take place in suspension in an inert solvent by reaction with a suitable chlorinating agent, for example $SiCl_4$. An example of a suitable inert solvent is diethyl glycol, dimethyl diglycol, tetrahydrofuran or chlorobenzene. During the activation of the surface of the semiconductor particles, the semiconductor particles can be doped by adding suitable compounds, for example $PCl_3$ or $BCl_3$.

The ligand is then bonded on by reacting the activated semiconductor particles of the corresponding organic compounds using known methods. Methods for the surface modification of chlorine-activated semiconductor particles are described, for example, in the reference by Holleman, Wiberg, titled "Lehrbuch der anorganischen Chemie [Textbook of Inorganic Chemistry]", Walter de Gruyter Berlin, New York, 1995; and by M. Kauzlarich et al., J. Am. Chem. Soc. 1996, 118, 12461 f.; U. Hilleringmann, titled "Silizium-Halbleitertechnologie" [Silicon Semiconductor Technology]" B. G. Teubner Verlag Stuttgart, Leipzig 1999.

The organic compound that forms the ligand particularly preferably contains a nucleophilic group that can react with the activated semiconductor particles, for example releasing hydrogen chloride. In this way, the ligand is bonded to the surface of the semiconductor particle by a linker group. In the context of the invention, a linker group is understood as meaning a group that contains at least one heteroatom by which the ligand is bonded to the surface of the semiconductor particle. Heteroatoms are understood as meaning atoms other than carbon and hydrogen. The linker group particularly preferably contains an oxygen, sulfur or nitrogen atom, by which the ligand is bonded to the surface of the semiconductor particle. The organic compounds that form the ligand accordingly for this purpose include a hydroxyl group, a thiol group or an amino group that can react as a nucleophilic group with the surface-activated semiconductor particle.

If the ligand is to be bonded to the surface of the semiconductor particle by a bond to a carbon atom, the activated semiconductor particle can, for example, be reacted with a suitable metalorganic compound.

The surface-modified semiconductor particles may be disposed isolated from one another in the semiconductor path. However, the surface-modified semiconductor particles preferably form agglomerates containing a plurality of surface-modified semiconductor particles, resulting in better electrical conductivity. The surface-modified semiconductor particles are particularly preferably in a polymer-like state. This can be achieved by the semiconductor particles being linked by at least bifunctional ligands and in this way forming a network. In this case, the ligands contain at least two linker groups, so that adjacent base bodies or semiconductor particles are linked by the ligands that contain at least two linker groups. The ligands may also contain other functional groups, by which, by way of example, interaction between the semiconducting material formed from the surface-modified semiconductor particles and metallic contact or organic and inorganic dielectrics can be improved.

The structure of the ligands can inherently be varied within wide limits. However, for cost reasons organic compounds that are as simple as possible and are available in large quantities are preferable for use as ligands. Therefore, the ligand preferably contains an alkyl or aryl group or, in the case of at least bifunctional ligands, an alkylene or arylene group. The alkyl or alkylene group preferably contains 1 to 20 carbon atoms, particularly preferably 1 to 10 carbon atoms. The alkyl or alkylene groups may be straight-chain or branched. Examples of suitable monofunctional ligands are propylamine, butanol or ethanethiol. Examples of suitable bifunctional ligands are hexamethylenediamine, glycol or propanedithiol. The aryl or arylene groups preferably contain 6–20 carbon atoms. Examples of suitable aryl groups are phenol or hydroquinone. Examples of suitable metalorganic compounds are butyllithium or alkylmagnesium halides, such a hexylmagnesium bromide. These ligands constitute just a small selection of the possible ligands.

To improve the fixing of the surface-modified semiconductor particles to the surface of a substrate, in a preferred embodiment the surface-modified semiconductor particles are embedded in an electrically nonconductive matrix. In this case, the matrix is preferably formed from an organic polymer, the matrix being selected in such a way that it leaves the electrical charge transport substantially unaffected. Examples of organic polymer materials are conventional dielectric synthetic plastics, such as epoxy resins, polyalkylenes, such as polyethylene or polypropylene resins, polystyrenes, polyurethanes, polyimides, polybenzoxazoles, polythiazoles, polyethers, polyether ketones, polyacrylates, polyterephthalates, polyethylene naphthalates, polycarbonates and mixtures of these polymers. In addition to the polymer, the matrix may also contain further compounds, for example dyes.

The semiconductor device according to the invention can be formed in numerous ways, for example as a diode. For this purpose, the semiconductor path contains at least a first section containing first surface-modified semiconductor particles and a second section containing second modified semiconductor particles which adjoins the first section. The semiconductor particles may in this case consist of the same base material, e.g. silicon, but with a different doping in the first and second sections, so that, for example, the first section is p-doped and the second section is n-doped.

If the semiconductor device is to be formed as a transistor, the first contact forms a source electrode, the second contact forms a drain electrode and a gate electrode which is insulated by a gate dielectric is also provided, enabling the charge carrier transport through the semiconductor path to be controlled.

The semiconductor device according to the invention can be produced at low cost and in a simple way, for example by printing techniques. Therefore, the subject of the invention is also a printable formulation, at least containing a solvent; and surface-modified semiconductor particles.

The surface-modified semiconductor particles used are the semiconductor particles that have already been described above in connection with the semiconductor device according to the invention. The surface modification enables the printable formulation to be provided as a stable solution or dispersion of the surface-modified semiconductor particles in the solvent. For example, the surface-modified semiconductor particles can therefore be used instead of the dye in standard inks for inkjet printing methods. Formulations of this type can readily be processed using standard inkjet printers.

The solvent of the printable formulation is expediently selected in such a way that, on the one hand, the surface-modified semiconductor particles are dissolved or form a stable dispersion and, on the other hand, the solvent is sufficiently volatile to enable it to be evaporated within a short time after the printable formulation has been applied to a substrate. Examples of suitable solvents are aliphatic or aromatic hydrocarbons, for example xylene.

In addition to the solvent and the surface-modified semiconductor particles, the printable formulation may also contain further constituents. For example, polymers may be added to the printable formulation and, after the solvent has evaporated, these polymers can form a matrix in which the surface-modified semiconductor particles are fixed. Examples of polymers that can be used are the polymers that were mentioned above in connection with the semiconductor device according to the invention.

Based on solids in the printable formulation, the formulation preferably contains 10 to 90% by weight, particularly preferably 50 to 90% by weight, of surface-modified semiconductor particles, and 10 to 90% by weight, particularly preferably 10 to 50% by weight, of polymer. The quantity of solvent is selected as a function of the viscosity required for the printing process. Based on the total quantity, the proportion of solvent is preferably 10 to 90% by weight, particularly preferably 50 to 90% by weight.

The semiconductor device according to the invention can be produced very easily and inexpensively, for example by standard printing methods. Therefore, the subject of the invention is also a method for fabricating the semiconductor device described above, in which a substrate is provided; at least one printable formulation as described above is provided; the at least one printable formulation is deposited on the substrate by a printing technique, so that a semiconductor path is obtained; and the semiconductor path is supplemented by further components to form a semiconductor device.

Inflexible substrates, such as for example carriers made from glass or quartz or silicon wafers, can be used as substrate in the fabrication of the semiconductor device according to the invention. However, it is preferable to use flexible substrates, such as plastic films made, for example, from polystyrene, polyethylene, polyester, polyurethane, polycarbonate, polyacrylate, polyimide, polyether or polybenzoxazoles, or alternatively paper. Components of the semiconductor device, such as for example source electrode, drain electrode and gate electrode, the gate electrode being insulated by a suitable gate dielectric, may already be defined on the substrate. Then, the printable formulation is applied to the substrate by a printing technique. The number of printable formulations used depends on the semiconductor device that is to be fabricated. For example, for the semiconductor path of a field effect transistor, only one printable formulation may be required, while to fabricate a diode structure at least two printable formulations are required, one containing p-doped semiconductor particles and the other containing n-doped semiconductor particles.

The printing technique that is used to apply the printable formulation to the substrate can be varied within wide limits. It is possible to use all conventional printing techniques. The printable formulation is particularly preferably applied to the substrate by inkjet, offset or flexographic printing.

Other features which are considered as characteristic for the invention are set forth in the appended claims.

Although the invention is illustrated and described herein as embodied in a surface-functionalized inorganic semiconductor particles as electrical semiconductors for microelectronics applications, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

EXAMPLE 1

Figure 1:
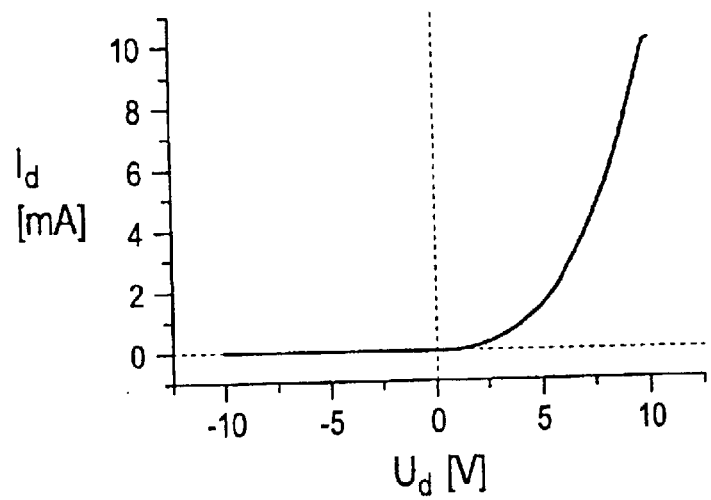
FIG. 1 is a graph showing a diode characteristic curve (pn junction) which was determined using the semiconductor device obtained in Example 20.

Surface activation of Si microparticles by use of hydrogen chloride in the gas phase 10 g of pulverized Si (p-doped, 1.8 Ωcm, grain size less <5 μm) were reacted with HCl for 15 min at 350° C. in a fluidized-bed reactor. This is followed by cooling under nitrogen for 30 minutes. The activated particles obtained in this way can then be reacted immediately in the reactor or stored under a dry argon atmosphere in an inert, dry solvent (e.g. diethyl glycol).

Yield 11 g of gray powder (highly hygroscopic).

EXAMPLE 2

Surface activation of Si microparticles by use of hydrogen chloride in the gas phase 10 g of pulverized Si (n-doped, 8.6 Ωcm, grain size less <5 μm) were reacted with HCl for 15 min at 350° C. in a fluidized-bed reactor. This is followed by cooling under nitrogen for 30 minutes. The activated particles obtained in this way can then be reacted immediately in the reactor or stored under a dry argon atmosphere in an inert, dry solvent (e.g. diethyl glycol).

Yield 10.5 g of brown powder (highly hygroscopic).

EXAMPLE 3

Surface activation of Si nanoparticles by use of hydrogen chloride in the gas phase 8 g of Si nanoparticles (grain size approximately 50 nm) were reacted with HCl for 15 minutes at 350° C. in a fluidized-bed reactor. This is followed by cooling under nitrogen for 30 minutes. The activated nanoparticles obtained in this way can then be reacted immediately in the reactor or stored under a dry argon atmosphere in an inert, dry solvent (e.g. diethyl glycol).

Yield 10.5 g of brown powder (highly hygroscopic).

EXAMPLE 4

Surface activation of Si microparticles by use of silicon tetrachloride in solution 10.1 g (0.36 mol) of pulverized Si (n-doped, 8.6 Ωcm, grain size <5 μm) are suspended in 300 ml of diethyl glycol and heated to boiling for 72 hours with 61.2 g (0.30 mol) of silicon tetrachloride with reflux in a round-bottomed flask apparatus provided with reflux condenser and argon purge. After cooling, the solvent and excess silicon tetrachloride are distilled off under reduced pressure. The activated particles obtained in this way can be stored under a dry argon atmosphere in an inert, dry solvent (e.g. diethyl glycol).

EXAMPLE 5

Surface activation of Si nanoparticles by use of silicon tetrachloride in solution 7.0 g (0.25 mol) of Si nanoparticles (grain size approximately 50 nm) are suspended in 200 ml of diethyl glycol and heated to boiling for 72 hours with 42.5 g (0.25 mol) of silicon tetrachloride with reflux in a round-bottomed flask apparatus provided with reflux condenser and argon purge. After cooling, the solvent and excess silicon tetrachloride are distilled off under reduced pressure. The activated nanoparticles obtained in this way can be stored under a dry argon atmosphere in an inert, dry solvent (e.g. diethyl glycol).

EXAMPLE 6

Surface functionalization of Si microparticles by use of butanol in the gas phase 5 g of the chlorine-activated microparticles obtained in Example 1 are quenched with 300 ml of 1-butanol at 150° C. in the fluidized-bed reactor under a nitrogen atmosphere. After cooling to room temperature, a suspension of butoxy-functionalized microparticles in butanol is obtained, and these microparticles can be isolated as a gray-brown powder by washing with water and subsequently drying in vacuo. Yield: 5.5 g; FTIR ν in cm$^{-1}$: 2926, 2855, 1464, 1384.

EXAMPLE 7

Surface functionalization of Si microparticles by use of butanol in the gas phase 4.9 g of the chlorine-activated microparticles obtained in Example 2 are quenched with 300 ml of 1-butanol at 150° C. in the fluidized-bed reactor under a nitrogen atmosphere. After cooling to room temperature, a suspension of butoxy-functionalized microparticles in butanol is obtained, and these particles can be isolated as a gray-brown powder by washing with water and subsequently drying in vacuo. Yield: 5.2 g; FTIR ν in cm$^{-1}$: 2928, 2857, 1465, 1381.

EXAMPLE 8

Surface functionalization of Si nanoparticles by use of butanol in solution 5 g of the chlorine-activated nanoparticles obtained in Example 5 are added to 100 ml of diethyl glycol in a round-bottomed flask apparatus provided with reflux condenser and argon purge, slowly mixed with 10 ml of 1-butanol and stirred at room temperature for 12 hours. The mixture is taken up in n-hexane and washed with water three times. The hexane phase is dried and the solvent evaporated. Yield: 4.8 g of brown powder; FTIR ν in cm$^{-1}$: 2931, 2857, 1460, 1377.

EXAMPLE 9

Surface functionalization of Si nanoparticles by use of phenol in solution 3 g of the chlorine-activated nanoparticles obtained in Example 5 are added to 70 ml of diethyl glycol in a round-bottomed flask apparatus provided with reflux condenser and argon purge, slowly mixed with 3 g of phenol and stirred at room temperature for 12 hours. The mixture is taken up in toluene and washed with water three times. The organic phase is dried and the solvent evaporated. Yield: 3.1 g of brown powder; FTIR ν in cm$^{-1}$: 3031, 1588, 1498, 1198.

EXAMPLE 10

Surface functionalization of Si nanoparticles by use of butyllithium in solution 4 g of the chlorine-activated nanoparticles obtained in Example 3 are added to 70 ml of diethyl glycol in a round-bottomed flask apparatus provided with reflux condenser and argon purge, slowly mixed with 12 ml of 2.5 M BuLi in hexane and stirred at room temperature for 12 hours. The mixture is taken up in hexane and washed with water three times. The organic phase is separated off, dried and the solvent evaporated. Yield: 3.4 g of brown powder; FTIR ν in cm$^{-1}$: 2957, 2929, 2858, 1465, 1378.

EXAMPLE 11

Surface functionalization of Si microparticles by use of hexylmagnesium bromide in solution 3 g of the chlorine-activated microparticles obtained in Example 4 are suspended in 70 ml of diethyl glycol in a round-bottomed flask apparatus provided with reflux condenser and argon purge, slowly mixed with 10 ml of 2.0 M HexMgBr in ether and stirred at room temperature for 12 hours. The mixture is filtered and the residue washed with water three times and with methanol twice. After drying in vacuum 2.7 g of gray powder are obtained. (FTIR ν in cm$^{-1}$: 2967, 2933, 2868, 1460, 1365).

EXAMPLE 12

Covalent linking of Si nanoparticles by use of 1,4-butanediol in solution.

5 g of the chlorine-activated nanoparticles obtained in Example 5 are added to 100 ml of diethyl glycol in a round-bottomed flask apparatus provided with reflux condenser and argon purge, slowly mixed with 10 ml of 1,4-butanediol and stirred at room temperature for 12 hours. The mixture is filtered and the residue washed with water three times and with methanol twice. After drying in vacuum, 5.1 g of brown powder are obtained. (FTIR ν in cm$^{-1}$: 3300, 2951, 2923, 2878, 1460, 1365, 1098).

EXAMPLE 13

Covalent linking of Si nanoparticles by use of hydroquinone in solution.

4 g of the chlorine-activated nanoparticles obtained in Example 5 are slowly mixed with 2.6 g of hydroquinone in 100 ml of diethyl glycol in a round-bottomed flask apparatus with reflux and argon purge and stirred at room temperature for 12 hours. The mixture is filtered and washed with water three times and with ethanol twice. After drying in vacuum, 4.5 g of brown powder are obtained. (FTIR v in $cm^{-1}$: 3520, 3031, 1680, 1581, 1488, 1193).

EXAMPLE 14

Covalent linking of Si microparticles by use of 1,4-dimercaptobutane in the gas phase.

5 g of the chlorine-activated microparticles obtained in Example 1 are quenched with 15 ml of 1,4-dimercaptobutane at 150° C. in the fluidized-bed reactor under a nitrogen atmosphere. After cooling to room temperature, the product is washed with 100 ml of diethyl glycol from the reactor cell. After washing with water and subsequent drying in vacuo, a gray-brown powder is isolated. Yield: 5.5 g; FTIR v in $cm^{-1}$: 3420, 2940, 2865, 1474, 1374.

The production of printable materials on the basis of the particle described in Example 5–14 is to be demonstrated below. The particles can be introduced into commercial printing inks or precursors thereof instead of the coloring pigments otherwise used, in variable filling levels and can be printed in the same way. The particles can also be dissolved or suspended with a solvent, together with a corresponding binder matrix, in a variable filling level and processed in this form (Examples 15–19). The binder matrix used is a material which is not itself conductive and which in the solid state embeds the inorganic particles without impairing electrical charge transport. The inert matrix materials used may be organic polymers.

Examples of organic polymer materials are conventional dielectric synthetic plastics, such as epoxy resins, polyalkylenes, such as polyethylene or polypropylene resins, polystyrenes, polyurethanes, polyimides, polybenzoxazoles, polythiazoles, polyethers, polyether ketones, polyacrylates, polyterephthalates, polyethylene naphthalate, polycarbonates of all types and other known plastics of this nature.

EXAMPLE 15

Production of a printable formulation of functionalized Si microparticles.

3 g of the microparticles produced in Example 6 are suspended in a solution of 1.4 g of polystyrene (Mw 280,000) in 7 g of xylene. The suspension is homogenized for 5 hours on a shaker apparatus and can then be processed.

EXAMPLE 16

Production of a printable formulation of functionalized Si nanoparticles.

3 g of the nanoparticles produced in Example 10 are dissolved in a solution of 1.4 g of polystyrene (Mw 280,000) in 7 g of xylene. The suspension is homogenized for 5 hours on a shaker apparatus and can then be processed.

EXAMPLE 17

Production of a printable formulation of covalently linked Si nanoparticles.

3 g of the nanoparticles produced under Example 12 are suspended in a solution of 1.4 g of polystyrene (Mw 280,000) in 7 g of xylene. The suspension is homogenized for 5 hours on a shaker apparatus and can then be processed.

EXAMPLE 18

Production of a printable formulation of functionalized Si microparticles (p-doped)

3 g of the nanoparticles produced under Example 6 are suspended in a solution of 1.4 g of polystyrene (Mw 280,000) in 7 g of xylene. The suspension is homogenized for 5 hours on a shaker apparatus and can then be processed.

EXAMPLE 19

Production of a printable formulation of functionalized Si microparticles (n-doped)

3 g of the nanoparticles produced under Example 7 are suspended in a solution of 1.4 g of polystyrene (Mw 280,000) in 7 g of xylene. The suspension is homogenized for 5 hours on a shaker apparatus and can then be processed.

A test structure for Examples 20 and 21 was produced by inkjet printing. For this purpose, a drop of the corresponding suspension is applied to a glass carrier via a nozzle of a micro-metering device. The solvent is then evaporated by the glass substrate being dried on a hot plate at 100° C. for 2 minutes. A circular test spot of the surface-modified microparticle with a diameter of approximately 500 micrometers was obtained. The glass carrier is clamped under a microscope, and a drop of a further suspension is applied to the glass carrier in such a manner that precisely one point of contact with the test spot of the first drop is produced. Then, the glass substrate is heated again for 2 minutes at 100° C. in order to evaporate the solvent. The current/voltage curve is taken by making contact using metal needles and evaluation using a parameter-measuring unit.

EXAMPLE 20

A diode structure is produced by inkjet printing using the printable formulations obtained in Examples 18 and 19 and a diode characteristic curve measured. The measured curve is plotted in FIG. 1.

EXAMPLE 21

Figure 2:
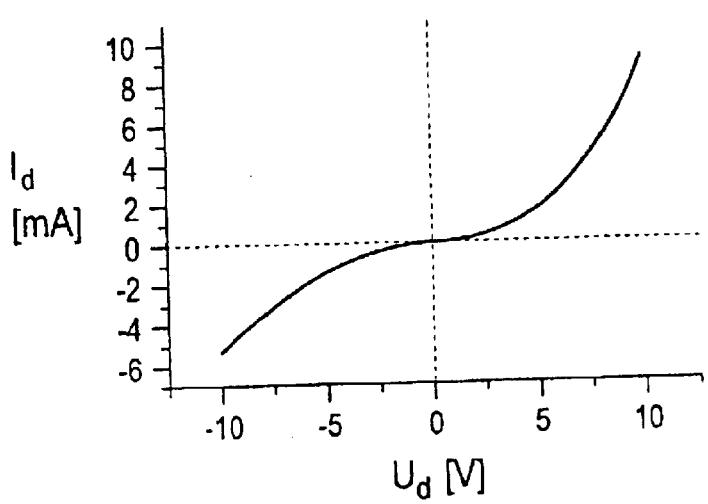
FIG. 2 is a graph showing a current-voltage curve (nn junction) which was determined using the configuration obtained in Example 21.

Inkjet printing using the printable formulation obtained in Example 19 is used to produce a semiconductor path between two identical semiconductor formulations, and a current/voltage curve is measured. The measured curve is plotted in FIG. 2.

We claim:

1. A semiconductor device, comprising:
    at least one semiconductor path, said semiconductor path substantially formed from surface-modified semiconductor particles each having a base body formed from a semiconductor particle and a monomolecular layer of ligands disposed on a surface of said base body;
    a first contact coupled to said semiconductor path for injecting charge carriers into said semiconductor path; and
    a second contact coupled to said semiconductor path for extracting the charge carriers from said semiconductor path.

2. The semiconductor device according to claim 1, wherein said surface-modified semiconductor particles are formed from an inorganic material.

3. The semiconductor device according to claim 1, wherein said ligands are bonded on said base body by a covalent bond.

4. The semiconductor device according to claim 1, wherein said ligands are bonded to said base body by a linker group.

5. The semiconductor device according to claim 4, wherein said linker group contains an atom selected from the group consisting of oxygen atoms, sulfur atoms, nitrogen atoms and carbon atoms.

6. The semiconductor device according to claim 1, wherein a plurality of said surface-modified semiconductor particles are combined to form agglomerates.

7. The semiconductor device according to claim 1, wherein said ligands contain at least two linker groups, and adjacent base bodies are linked to form a network by said ligands which contain said at least two linker groups.

8. The semiconductor device according to claim 1, wherein said ligands contain an alkyl group or an aryl group.

9. The semiconductor device according to claim 1, wherein said semiconductor path has an electrically non-conductive matrix, and said surface-modified semiconductor particles are embedded in said electrically nonconductive matrix.

10. The semiconductor device according to claim 9, wherein said electrically nonconductive matrix is formed from an organic polymer.

11. The semiconductor device according to claim 1, wherein the semiconductor device is a transistor having a source electrode, a drain electrode, and a gate electrode insulated by a gate dielectric, said first contact forming said source electrode, and said second contact forming said drain electrode.

12. The semiconductor device according to claim 1, wherein:

the semiconductor device is a diode;

said surface-modified semiconductor particles include first surface-modified semiconductor particles and second modified semiconductor particles; and said semiconductor path contains at least a first section having said first surface-modified semiconductor particles and a second section having said second modified semiconductor particles adjoining said first section.

13. A method for fabricating a semiconductor device, which comprises the steps of:

providing a substrate;

depositing at least one printable formulation, containing a solvent and surface-modified semiconductor particles, on the substrate using a printing technique resulting in a formation of a semiconductor path, the surface-modified semiconductor particles each have a base body formed from a semiconductor particle and a monomolecular layer of ligands disposed on a surface of the base body;

coupling a first contact to the semiconductor path for injecting charge carriers into the semiconductor path; and coupling a second contact to said semiconductor path for extracting the charge carriers from the semiconductor path.

14. The method according to claim 13, which further comprises applying the printable formulation to the substrate using a printing process selected from the group consisting of inkjet printing, offset printing and flexographic printing.

* * * * *